United States Patent
Tung et al.

(10) Patent No.: US 7,663,512 B2
(45) Date of Patent: Feb. 16, 2010

(54) DECODER AND METHOD FOR DECODING A MESSAGE USING AN ARBITRARY-SIDE GROWING HUFFMAN TREE

(75) Inventors: Yi-Shin Tung, Taipei Hsien (TW); Sung-Wen Wang, Taipei (TW); Yi-Chin Huang, Taipei Hsien (TW); Ja-Ling Wu, Taipei (TW)

(73) Assignees: Hon Hai Precision Industry Co., Ltd., Tu-Cheng, Taipei Hsien (TW); National Taiwan University, Taipei (TW)

( * ) Notice: Subject to any disclaimer, the term of this patent is extended or adjusted under 35 U.S.C. 154(b) by 15 days.

(21) Appl. No.: 12/177,096

(22) Filed: Jul. 21, 2008

(65) Prior Publication Data
US 2010/0013679 A1      Jan. 21, 2010

(51) Int. Cl.
    *H03M 7/40* (2006.01)
(52) U.S. Cl. .......................................... 341/65; 341/106
(58) Field of Classification Search ................ 341/65, 341/67, 50, 106; 375/E7.231
See application file for complete search history.

(56) References Cited

U.S. PATENT DOCUMENTS

| 7,348,901 B2 * | 3/2008 | De Martin et al. ............ 341/67 |
| 7,358,870 B2 * | 4/2008 | Bay ............................. 341/65 |
| 7,573,407 B2 * | 8/2009 | Reznik ........................ 341/67 |
| 2006/0176195 A1 | 8/2006 | Thirumoorthy |

* cited by examiner

*Primary Examiner*—Brian Young
(74) *Attorney, Agent, or Firm*—Frank R. Niranjan

(57) ABSTRACT

A decoder for decoding a message using an arbitrary-side growing (ASG) Huffman tree including a plurality of codewords and symbols includes a database, a processing module, and a bit pattern matching module. The database stores a plurality of parameters corresponding to the ASG Huffman tree divided into several sub-trees according to a Hashemian cut operation and a bits-pattern-Xor (BPX) operation. The plurality of parameters include a bit pattern of a sub-tree of the ASG Huffman tree divided according to the BPX operation and a code length of the bit pattern. The processing module receives a bit stream corresponding to the ASG Huffman tree from an encoder. The bit pattern matching module selects bits from the bit stream according to the code length of the bit pattern and decodes the selected bits into a symbol in the ASG Huffman tree by comparing the selected bits with the bit pattern.

15 Claims, 8 Drawing Sheets

| mi | $m_0$ | $m_1$ | $m_2$ | $m_3$ | $m_4$ | $m_5$ | $m_6$ | $m_7$ | $m_8$ | $m_9$ | $m_{10}$ | $m_{11}$ | $m_{12}$ | $m_{13}$ | $m_{14}$ | $m_{15}$ | $m_{16}$ | $m_{17}$ | $m_{18}$ | $m_{19}$ | $m_{20}$ | $m_{21}$ | $m_{22}$ |
|---|---|---|---|---|---|---|---|---|---|---|---|---|---|---|---|---|---|---|---|---|---|---|---|
| val |  | 3 | 6 |  | 0 | 7 | 7 | 7 | 7 | 8 | 5 | 4 |  | 1 | 2 |  | 15 | 11 | 10 | 9 | 14 | 13 | 12 |
| cl |  | 2 | 2 |  | 2 | 1 | 1 | 1 | 1 | 3 | 3 | 3 |  | 1 | 2 |  | 4 | 4 | 1 | 2 | 3 | 4 | 4 |
| sign | 1 | 0 | 0 | 1 | 0 | 0 | 0 | 0 | 0 | 0 | 0 | 0 | 1 | 0 | 0 | 1 | 0 | 0 | 0 | 0 | 0 | 0 | 0 |
| len | 2 |  |  | 3 |  |  |  |  |  |  |  |  |  |  |  |  |  |  |  |  |  |  |  |
| pat |  |  |  |  |  |  |  |  |  |  |  |  | 11 |  |  | 0 |  |  |  |  |  |  |  |
| bl |  |  |  |  |  |  |  |  |  |  |  |  | 4 |  |  | 4 |  |  |  |  |  |  |  |
| os | 1 |  |  | 2 |  |  |  |  |  |  |  |  | 1 |  |  | 3 |  |  |  |  |  |  |  |

FIG. 7

DECODER AND METHOD FOR DECODING A MESSAGE USING AN ARBITRARY-SIDE GROWING HUFFMAN TREE

RELATED APPLICATION

This application is a formal application of U.S. provisional patent application Ser. No. 60/958,644, filed Jul. 6, 2007, entitled "Decoder and Method for Decoding an Arbitrary-side Growing Huffman Tree." The foregoing patent application is incorporated in its entirety herein by reference.

BACKGROUND

1. Field of the Invention

Embodiments of the present disclosure relate to decoders and, more particularly, to a decoder for decoding messages using an arbitrary-side growing Huffman tree.

2. Description of Related Art

With the development of Huffman decoding technologies, applications using Huffman decodings are increasingly applied in various fields. Entropy coding in data compression applications widely relies on Huffman codes, but most software approaches using entropy decoding are limited to sequential decoding. As a representation of each symbol in Huffman decodings varies in size, it is difficult to speed up the decoding process. Consequentially, current researches have aimed to find a fast and memory-effective way to process Huffman decoding.

One such scheme for realizing fast Huffman decoding uses a single-side growing (SSG) Huffman tree, which is a fast algorithim when Huffman trees grow in a fixed direction. However, if the Huffman tree is arbitrary-side growing (ASG), the Huffman decoding processing the SSG Huffman tree is slower and memory-inefficient, requiring significantly memory capacity.

SUMMARY

A decoder for decoding a message using an arbitrary-side growing (ASG) Huffman tree including a plurality of codewords and symbols includes a database, a processing module, and a bit pattern matching module. The database is configured for storing a plurality of parameters corresponding to the ASG Huffman tree, where the ASG Huffman tree is divided into several sub-trees according to a Hashemian cut (HC) operation and a bits-pattern-Xor (BPX) operation, and the plurality of parameters includes a bit pattern of a sub-tree divided according to the BPX operation and a code length of the bit pattern and the bit pattern represents a path traversing the sub-tree. The processing module is configured for receiving a bit stream corresponding to the ASG Huffman tree from an encoder. The bit pattern matching module is configured for selecting bits from the bit stream according to the code length of the bit pattern and decoding the selected bits into a symbol in the ASG Huffman tree by comparing the selected bits with the bit pattern.

Other advantages and novel features will become more apparent from the following detailed description when taken in conjunction with the accompanying drawings:

BRIEF DESCRIPTION OF THE DRAWINGS

FIG. 7 is one embodiment of a decoding table corresponding to the arbitrary-side growing Huffman tree of FIG. 2.

DETAILED DESCRIPTION OF CERTAIN INVENTIVE EMBODIMENTS

All of the processes described below may be embodied in, and fully automated via, software code modules executed by one or more general purpose computers or processors. The code modules may be stored in any type of computer-readable medium or other computer storage device. Some or all of the methods may alternatively be embodied in specialized computer hardware.

As used herein, the term, "tree" defines a data structure that may graphically illustrate a tree structure with a set of linked nodes. A node may contain a value or a condition or represent a separate data structure or a tree of its own. Each node in a tree has zero or more child nodes, which are below it in the tree. A node that has a child is called the child's parent node so as to define at most one parent per a node. A topmost node in a tree is called the root node; the root node will not have any parents. Nodes at the bottommost level of the tree are called leaf nodes where they do not have any children. A sub-tree is a portion of a tree data structure that can be viewed as a complete tree in itself.

Figure 1:
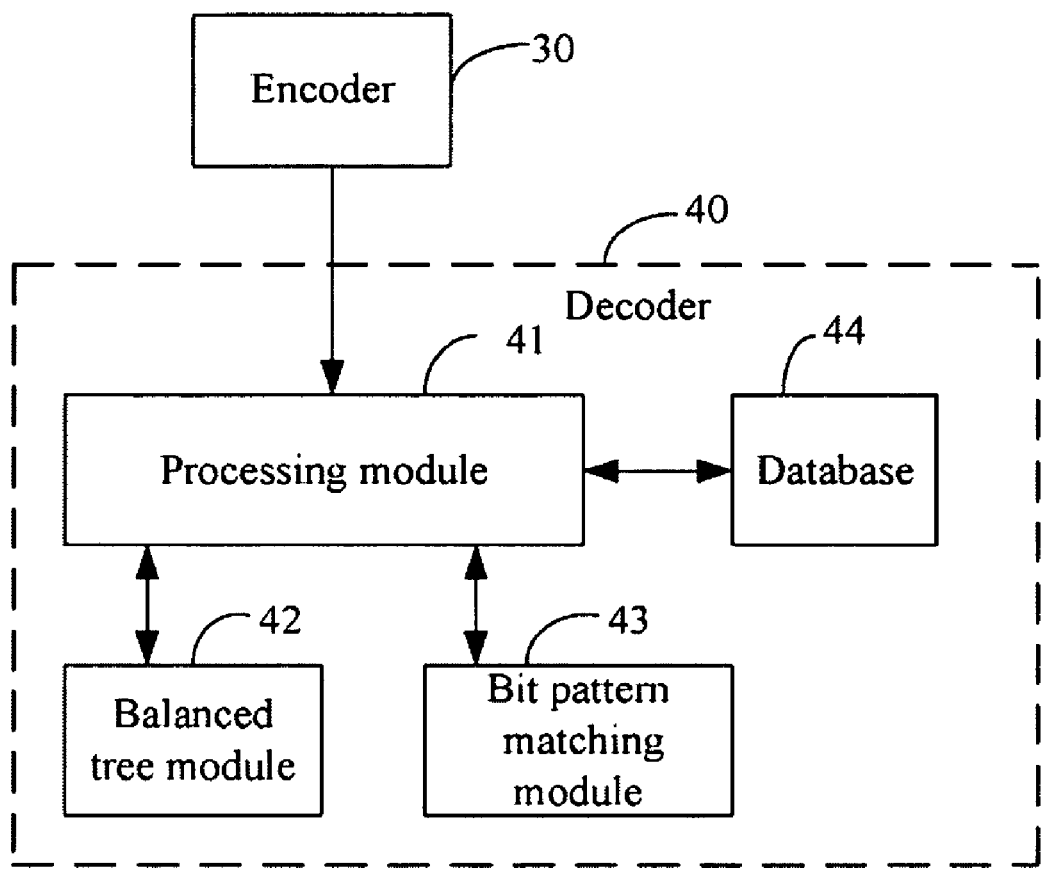
FIG. 1 is a block diagram of one embodiment of a decoder of the present disclosure.

FIG. 1 is a block diagram of one embodiment of a decoder 40 of the present disclosure. In one embodiment, the decoder 40 is connected to an encoder 30 and is used for decoding a bit stream sent by the encoder 30. The decoder 40 may receive an encoding message sent by the encoder 30, where the encoding message includes a Huffman tree message. In one embodiment, the bit stream may correspond to an arbitrary-side growing (ASG) Huffman tree. Specifically, the bit stream may be the result of data encoding using the arbitrary-side growing (ASG) Huffman tree. In one embodiment, the decoder 40 may be a Video LAN Client (VLC) decoder, while the encoder 30 may be a VLC encoder.

In one embodiment, the decoder 40 includes a processing module 41, a balanced tree module 42, a bit pattern matching module 43, and a database 44. The processing module 41 is connected to the encoder 30. The processing module 41 receives an encoding message and a bit stream from the encoder 30 and determines a decoding table corresponding to the bit stream from the database 44 via the encoding message. The processing module 41 then sends the bit stream either to the balanced tree module 42 or to the bit pattern matching module 43 to be decoded.

Figure 2:
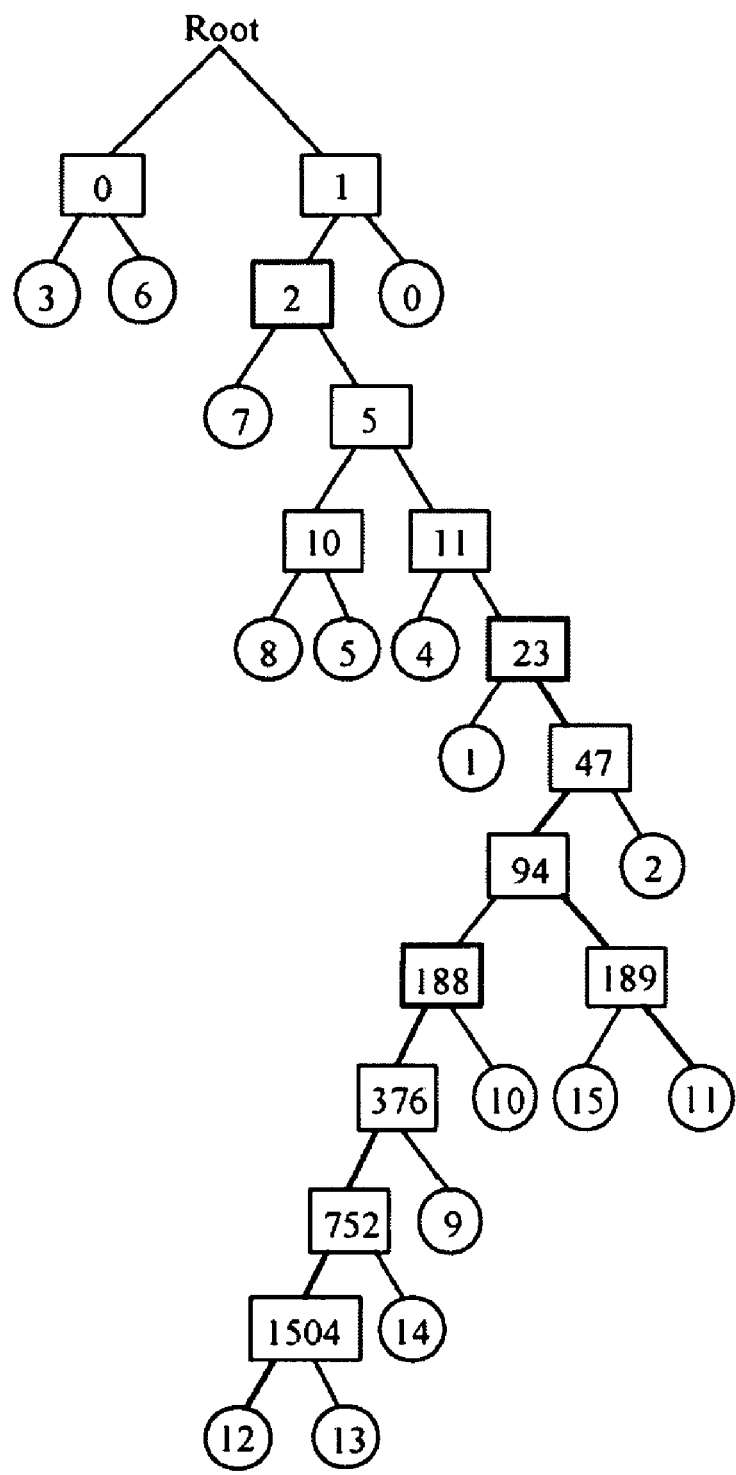
FIG. 2 is a schematic diagram of one embodiment of an arbitrary-side growing Huffman tree.

The database 44 is used for storing a plurality of decoding tables. As mentioned above, each decoding table may correspond to an ASG Huffman tree. It may be understood that a single-side growing (SSG) Huffman tree is a Huffman tree with a plurality of non-leaf nodes, where the non-leaf nodes are either all on the left or right child nodes with respect to parent nodes thereof. Specifically, non-leaf nodes in a SSG Huffman tree extends from a root of the SSG Huffman tree in one direction. Contrary to a SSG Huffman tree, the ASG Huffman tree includes a plurality of non-leaf nodes, where at least one of the non-leaf nodes is a left child of a parent node and other non-leaf nodes are right children of parent nodes. For example, FIG. 2 is a schematic diagram of an ASG Huffman tree. In the embodiment of FIG. 2, a rectangular box represents a codeword (cw), and specifically, a non-leaf node. A circle node represents a symbol, and specifically, a leaf node. FIGS. 3, 4, 5, and 6 are sub-trees of the ASG Huffman tree of FIG. 2 divided according to a Hashemian cut (HC) operation and a bits-pattern-Xor (BPX) operation. In one embodiment, "sb (cw)" represents a sub-tree root with a codeword value cw. For example, "sb (2)" represents a sub-tree root of FIG. 4 with a codeword value 2, "sb (23)" represents a sub-tree root of FIG. 5 with a codeword value 23, and "sb (188)" represents a sub-tree root of FIG. 6 with a codeword value 188.

FIG. 7 is one embodiment of a decoding table corresponding to the ASG Huffman tree of FIG. 2. In one embodiment, the decoding table includes a plurality of parameters including $m_i$, val, cl, sign, len, pat, bl, and os. In one embodiment, a value of the subscripted variable i in the parameter $m_i$ represents a memory index in the database 44. As shown in FIG. 7, the values of the subscripted variable i in the parameter $m_i$ may vary from 0 to 22. Specifically, the parameter $m_i$ includes $m_0$ to $m_{22}$ in the embodiment of FIG. 7. However, it may be appreciated that the value of the subscripted variable i in the parameter $m_i$ may comprise other range of values depending on the embodiment.

Figure 3:
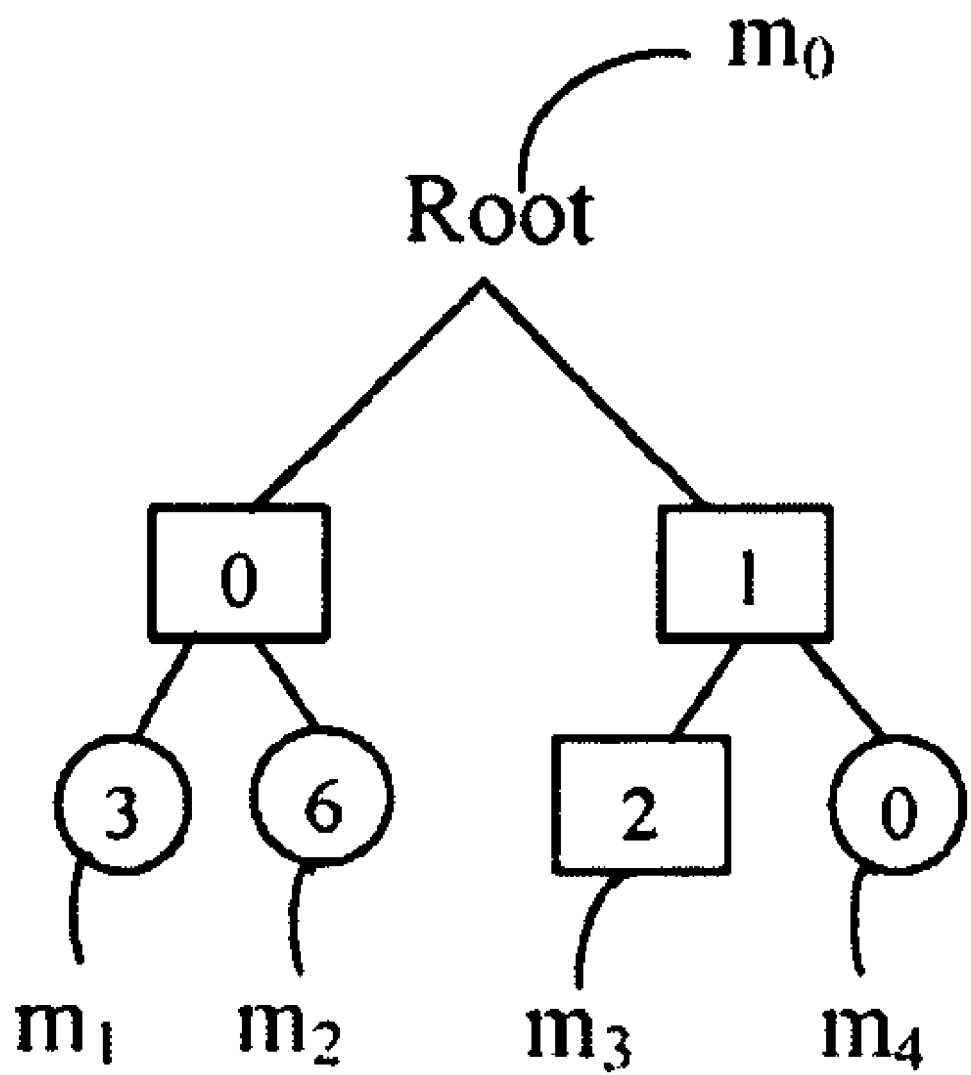
FIG. 3 is a sub-tree of the arbitrary-side growing Huffman tree of FIG. 2.
Figure 4:
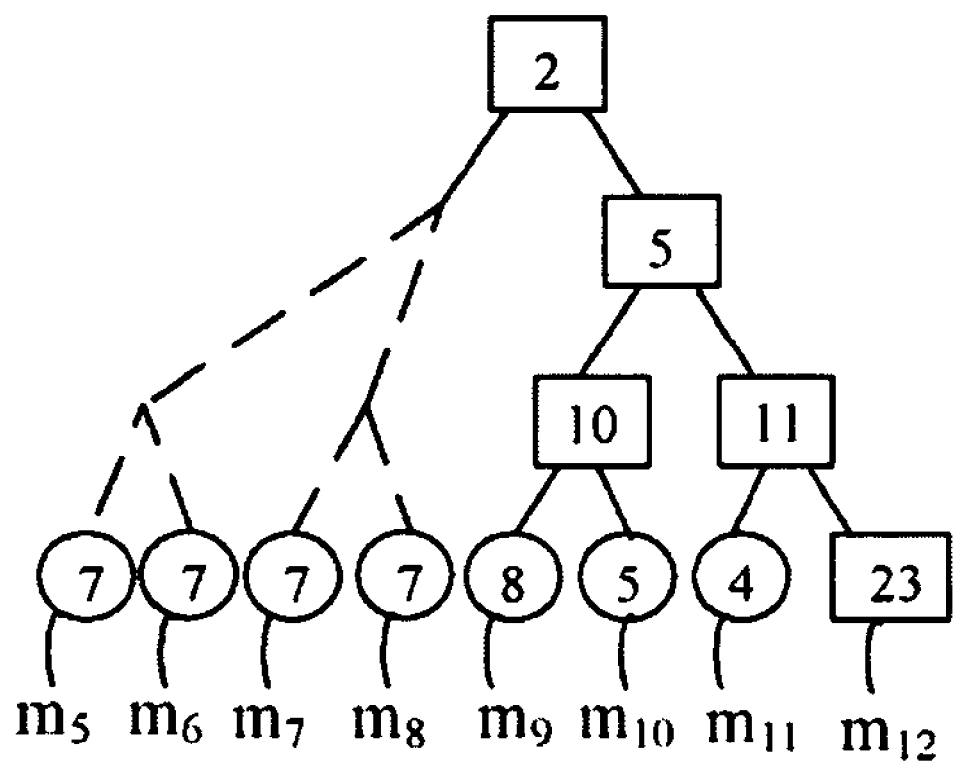
FIG. 4 is another sub-tree of the arbitrary-side growing Huffman tree of FIG. 2.
Figure 5:
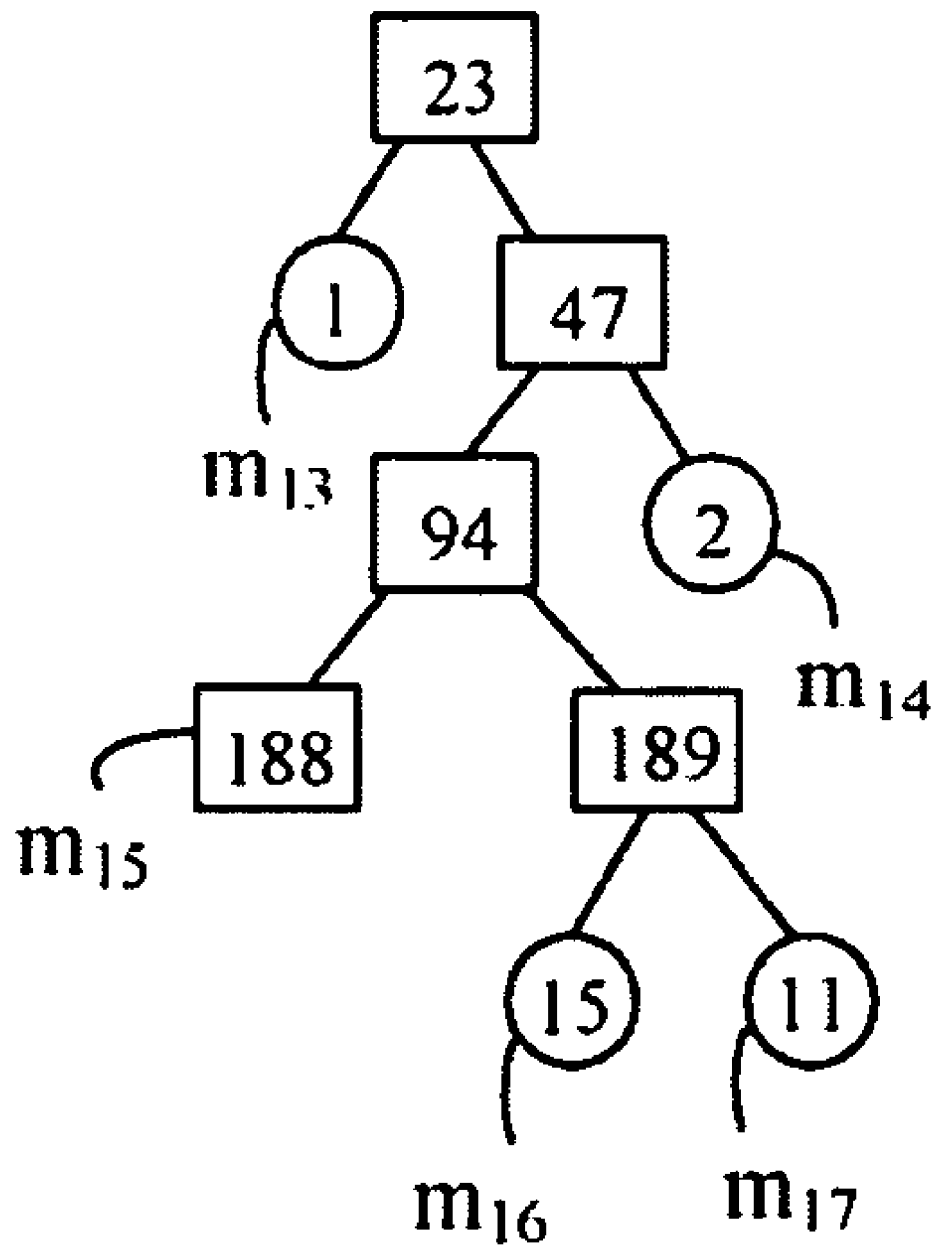
FIG. 5 is another sub-tree of the arbitrary-side growing Huffman tree of FIG. 2.
Figure 6:
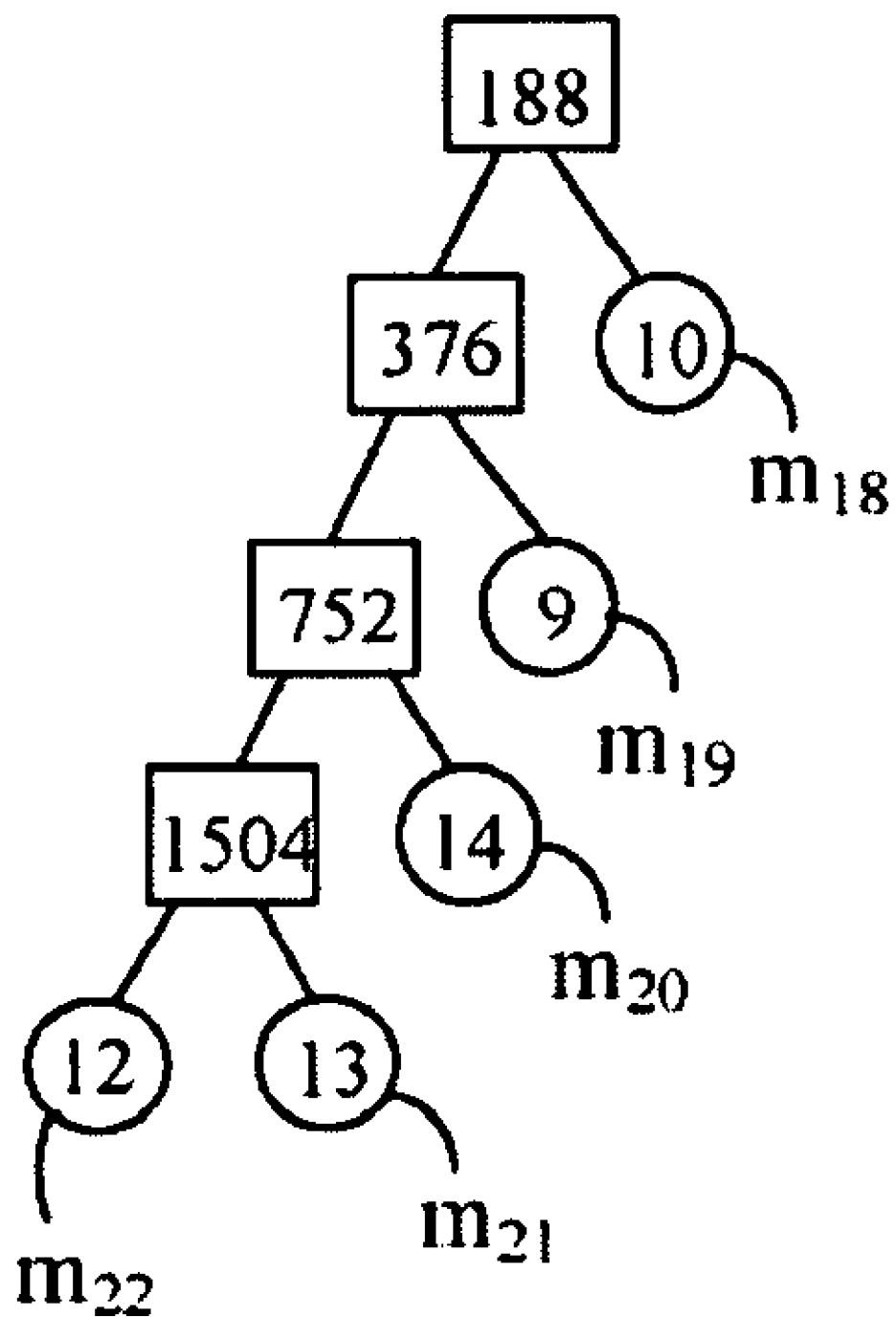
FIG. 6 is another sub-tree of the arbitrary-side growing Huffman tree of FIG. 2.

The parameter val represents a value of a symbol in the ASG Huffman tree of FIG. 2. The parameter val ($m_i$) represents a value of a symbol corresponding to the parameter $m_i$ in FIGS. 3-6. The parameter cl ($m_i$) represents a code length of a symbol corresponding to the parameter $m_i$ in a sub-tree. For example, as shown in FIG. 4, if the value of i in the parameter $m_i$ is 9 (i.e., $m_9$), a value of a corresponding symbol is 8, requiring 3 bits to be encoded and decoded utilizing the sub-tree (e.g., how many branches between the symbol and a root of the sub-tree). Thus, the code length of the symbol 8 is 3, i.e. the parameter cl ($m_9$) is 3. As another example, as shown in FIG. 5, if the value of i in the parameter $m_i$ is 16 (i.e. $m_{16}$), a value of a corresponding symbol is 15, requiring 4 bits to be encoded and decoded utilizing the sub-tree. Thus, the code length of the symbol 15 is 4, that is, the parameter cl ($m_{16}$) is 4.

The parameter sign ($m_i$) that represents a node corresponding to the parameter $m_i$ is a symbol or a codeword. In one embodiment, if the parameter sign ($m_i$) is 0, the node corresponding to the parameter sign ($m_i$) is a symbol. If the parameter sign ($m_i$) is 1, the node corresponding to the parameter sign ($m_i$) is a codeword. In alternative embodiments, the parameter sign ($m_i$) may be other digits or letters. The parameter len ($m_i$) represents a length of a sub-tree divided according to the HC operation. The parameter pat ($m_i$) represents a bit pattern of a sub-tree divided according to the BPX operation, whose root is a codeword corresponding to the parameter $m_i$, and the parameter bl ($m_i$) represents a code length corresponding to the parameter pat ($m_i$). The bit pattern of an ASG Huffman tree represents a path traversing the ASG Huffman tree. For example, as in FIG. 5, when a left child of a parent node represents a binary bit 0 and a right child of the parent node represents a binary bit 1, a path traversing the sub-tree from a node 23 through nodes 47, 94, and 189, and finally to a node 11 can be represented by the parameter pat $(m_{12})=(1011)_2=(11)_{10}$, and the parameter bl $(m_{12})=4$. Similarly, as in FIG. 6, a path traversing the sub-tree from a node 188 through nodes 376, 752, and 1504, and finally to a node 12 can be represented by the parameter pat $(m_{15})=(0000)_2=0$, and the parameter bl $(m_{15})=4$.

The parameter os ($m_i$) represents an offset between a value of i in the parameter $m_i$ corresponding to a codeword of a sub-tree and a value of i in the parameter mj (j>i) corresponding to a first symbol of a next sub-tree. For example, FIG. 3 shows a sub-tree, FIG. 4 shows a next sub-tree of the sub-tree of FIG. 3, a codeword 2 of FIG. 3 is corresponding to the parameter $m_3$, which has a value 3 of i, and the first symbol of FIG. 4 is corresponding to the parameter $m_5$, which has a value 5 of i. Therefore the offset between 3 and 5 is 2. Specifically, the parameter os ($m_3$) is 2.

The processing module 41 is further configured for selecting other parameters corresponding to the parameter $m_i$ from the decoding table and determining whether a node corresponding to the parameter $m_i$ is a symbol or a codeword. In one embodiment, the processing module 41 determines whether the node corresponding to the parameter $m_i$ is a symbol or a codeword according to the parameter sign ($m_i$). If the processing module 41 determines the parameter sign ($m_i$) is 0, signifying the node corresponding to the parameter $m_i$ is a symbol, then the processing module 41 outputs the parameter val ($m_i$) in the decoding table to the database 44 for storage. If the processing module 41 determines the parameter sign ($m_i$) is 1, signifying the node corresponding to the parameter $m_i$ is a codeword, then the processing module 41 further determines whether the parameter len ($m_i$) is null. If the processing module 41 determines the parameter len ($m_i$) is null, then the processing module 41 sends the other parameters corresponding to the parameter $m_i$ and the bit stream to the bit pattern matching module 43. If determining the parameter len ($m_i$) is not null, then the processing module 41 sends the other parameters corresponding to the parameter $m_i$ and the bit stream to the balanced tree module 42.

In one embodiment, the processing module 41 processes the decoding from the root of the ASG Huffman tree. In one particular embodiment, the processing module 41 first selects other parameters corresponding to the parameter $m_0$. It may be understood that the other parameters corresponding to the parameter $m_0$ include the parameter val ($m_0$), the parameter cl ($m_0$), the parameter sign ($m_0$), the parameter len ($m_0$), the parameter pat ($m_0$), the parameter bl ($m_0$), and the parameter os ($m_0$). With reference to FIG. 7, if the parameter sign ($m_0$) is 1 and the parameter len ($m_0$) is not null, then the processing module 41 sends the other parameters corresponding to the parameter $m_0$ and the bit stream to the balanced tree module 42.

The balanced tree module 42 is configured for selecting bits from the bit stream according to the parameter len ($m_i$), decoding the selected bits into a node in the ASH Huffman tree, and determining the node according to a decimal value of the selected bits. In one embodiment, the balanced tree module 42 is configured for selecting other parameters corresponding to the parameter $m_i$ and the bit stream from the processing module 41, selecting a number of the most significant bits from the bit stream equal to the parameter len ($m_i$), and determining a decimal value of the selected bits from the bit stream. After determining the decimal value of the selected bits, then the balanced tree module 42 adds the value of i in the parameter $m_i$, the parameter os ($m_i$), and the decimal value of the selected bits from the bit stream to get a value of another i in parameter $m_i$.

In one particular embodiment, if the bit stream is 101111010, the parameter len ($m_0$) is 2, and the parameter os ($m_0$) is 1, then the balanced tree module 42 selects 2 bits from the bit stream (i.e., the 2 most significant bits 10), and leaves other bits from the bit stream as a remaining bit stream 1111010, being the seven least significant bits of the bit stream 101111010. The balanced tree module 42 determines a decimal value of the selected bits from the bit stream, which is 2. Therefore, the value of another i in the parameter $m_i$ is equal to 0 plus 1 plus 2, resulting in 3. The balanced tree module 42 further sends the value of another i in the parameter $m_i$ and the remaining bit stream 1111010 to the processing module 41.

The processing module 41 is further configured for receiving the value of another i in the parameter $m_i$ and the remaining bit stream from the balanced tree module 42, as well as selecting other parameters corresponding to the other parameter $m_i$ from the decoding table. Referring to the above example, the processing module 41 selects the other parameters corresponding to the parameter $m_3$, including the parameter val ($m_3$), the parameter cl ($m_3$), the parameter sign ($m_3$), the parameter len ($m_3$), the parameter pat ($m_3$), the parameter bl ($m_3$), and the parameter os ($m_3$). The processing module 41 determines that the parameter sign ($m_3$) is 1, and then determines the parameter len ($m_3$) is not null. Subsequently, the processing module 41 sends the other parameters corresponding to the parameter $m_3$ and the remaining bit stream 1111010 to the balanced tree module 42.

The balanced tree module 42 receives the other parameters corresponding to the parameter $m_3$ and the remaining bit stream 1111010. In one particular embodiment, if the parameter len ($m_3$) is 3 and the parameter os ($m_3$) is 2, then the balanced tree module 42 selects the 3 most significant bits from the remaining bit stream 1111010, which are 111. The balanced tree module 42 determines a decimal value of the selected bits 111, which is 7. Therefore, the value of another i in the parameter $m_i$ is equal to 3 plus 2 plus 7, resulting in 12. The balanced tree module 42 further sends the value of another i in the parameter $m_i$ and another remaining bit stream to the processing module 41. At this time, the other remaining bit stream is 1010.

The processing module 41 receives the value of another i in the parameter $m_i$ and the other remaining bit stream, and selects other parameters corresponding to the other parameter $m_i$. Referring to the above example, the processing module 41 selects other parameters corresponding to the parameter $m_{12}$, including the parameter val ($m_{12}$), the parameter cl ($m_{12}$), the parameter sign ($m_{12}$), the parameter len ($m_{12}$), the parameter pat ($m_{12}$), the parameter bl ($m_{12}$), and the parameter os ($m_{12}$). The processing module 41 determines the parameter sign ($m_{12}$) is 1, and then determines the parameter len ($m_{12}$) is null. Subsequently, the processing module 41 sends the other parameters corresponding to the parameter $m_{12}$ and the other remaining bit stream 1010 to the bit pattern matching module 43.

The bit pattern matching module 43 selects bits from the other remaining bit stream according to the parameter bl ($m_i$), and decodes the selected bits into a symbol represented by a specific leaf node in the ASG Huffman tree by comparing the selected bits with the bit pattern according to the parameter $m_i$ and determining a symbol according to a number of leading bits having the same value in the result of the comparison. The bit pattern matching module 43 is configured for receiving the other parameters corresponding to the parameter $m_i$ and the other remaining bit stream from the processing module 41, selecting a number of bits from the other remaining bit stream equal to the parameter bl ($m_i$), comparing the selected bits with a binary value of the parameter pat ($m_i$), and counting the number of leading bits having the same value in the result of the comparison.

Still referring to the above example, the parameter bl ($m_{12}$) is 4 and the other remaining bit stream is 1010. The bit pattern matching module 43 selects 4 bits from the other remaining bit stream "1010" and matches the selected 4 bits "1010" with the binary value of the parameter pat ($m_{12}$)=$(11)_{10}$=$(1011)_2$. In one embodiment, the bit pattern matching module 43 matches the selected 4 bits "1010" with the binary value 1011 of the parameter pat ($m_{12}$) via a binary exclusive OR operation (XOR), resulting in 0001, and the number of leading bits having the same value of 0 is 3. The bit pattern matching module 43 is further configured for setting a value of another i in the parameter $m_i$ as the value of i in the parameter $m_i$ plus the parameter os ($m_i$) plus the number of leading bits having the same value. The bit pattern matching module 43 utilizes the result of the binary XOR operation as an identifier to determine a specific leaf node representing a symbol into which the selected bits are to be decoded. In one embodiment, the value of another i in the parameter $m_i$ is 12 plus 1 plus 3, resulting in 16, and the bit pattern matching module 43 sends the value of another i in the parameter $m_i$ and the remaining bit stream to the processing module 41. In one embodiment, the remaining bit stream is null.

The processing module 41 is further configured for receiving the value of another i in the parameter $m_i$ sent by the bit pattern matching module 43, and selecting other parameters corresponding to the parameter $m_i$. In one embodiment, the processing module 41 selects the other parameters corresponding to the parameter $m_{16}$, including the parameter val ($m_{16}$), the parameter cl ($m_{16}$), the parameter sign ($m_{16}$), the parameter len ($m_{16}$), the parameter pat ($m_{16}$), the parameter bl ($m_{16}$), and the parameter os ($m_{16}$). The processing module 41 determines the parameter sign ($m_{16}$) is 0, then, the processing module 41 sends the parameter val ($m_{16}$) to the database 44 for storage. In one embodiment, the parameter val ($m_{16}$) is 15. Therefore, the decoder 40 decodes the bit stream 101111010 sent by the encoder 30 into 15.

Figure 8:
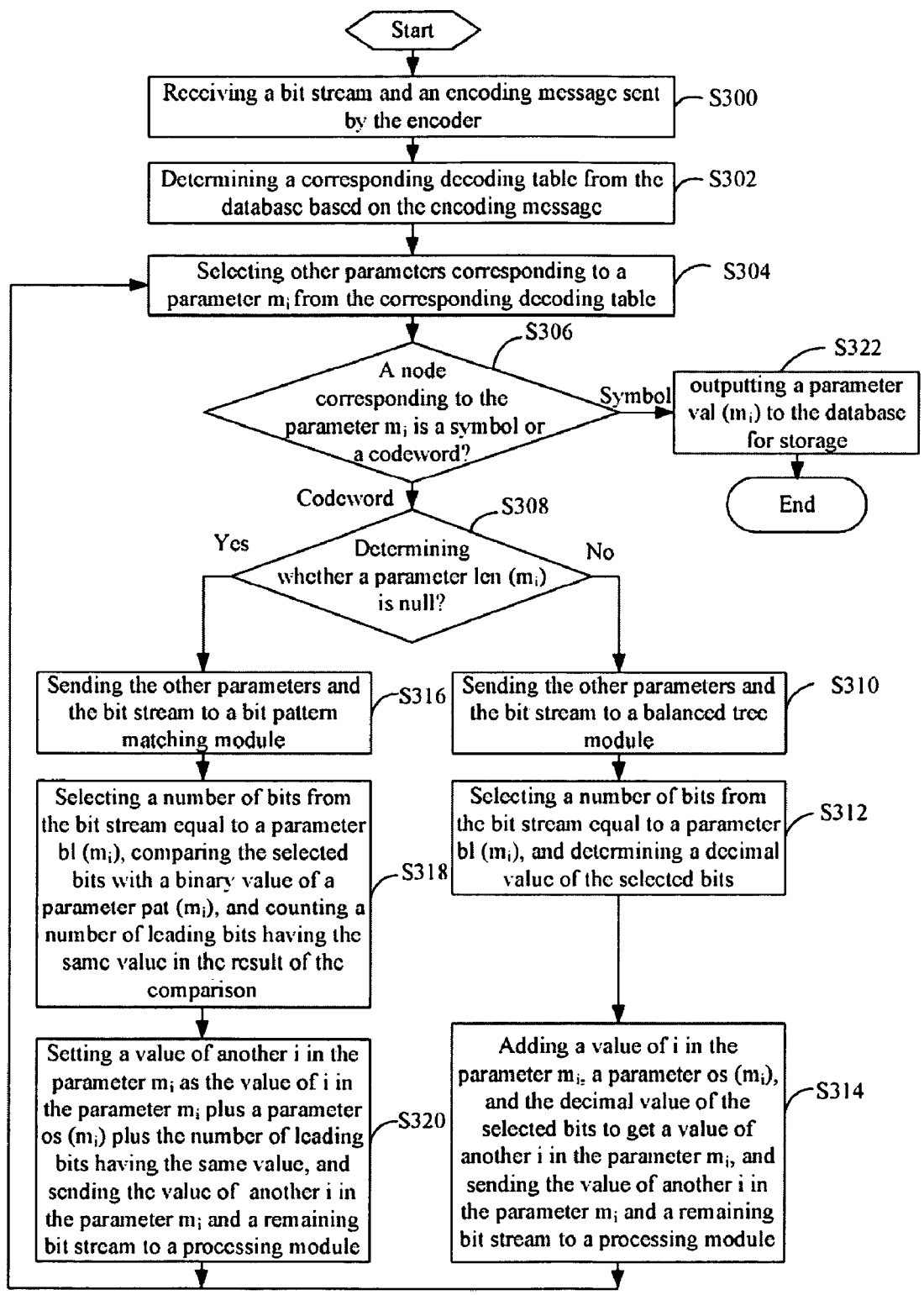
FIG. 8 is a flowchart of one embodiment of a decoding method of the present disclosure.

FIG. 8 is a flowchart of one embodiment of a decoding method of the present disclosure. The method of FIG. 8 may be used to decode a bit stream of a electrical signal or an electronic file. In block S300, the decoder 40 receives a bit stream 101111010 and an encoding message of the bit stream 101111010 sent by the encoder 30. In one embodiment, the encoding message of the bit stream 101111010 includes a Huffman tree message and the bit stream 101111010 corresponds to the Huffman tree in the encoding message.

In block S302, the decoder 40 determines a corresponding decoding table from the database 44 based on the encoding message. In one embodiment, the decoding table includes a plurality of parameters including $m_i$, val, cl, sign, len, pat, bl, and os. A value of the subscripted variable i in the parameter $m_i$ represents a memory index in the database 44. As shown in FIG. 7, the values of the subscripted variable i in the parameter $m_i$ may vary from 0 to 22. Specifically, the parameter $m_i$ includes $m_0$ to $m_{22}$ in the embodiment of FIG. 7. However, it may be appreciated that the value of the subscripted variable i in the parameter $m_i$ may comprise other ranges of values depending on the embodiment.

The parameter val represents a value of a symbol in the ASG Huffman tree. The parameter val ($m_i$) represents a value of a symbol corresponding to the parameter $m_i$ in FIGS. 3-6. The parameter cl ($m_i$) represents a code length of a symbol corresponding to the parameter $m_i$ in a sub-tree. For example, as shown in FIG. 4, if the value of the subscripted i in the parameter $m_i$ is 9 (i.e. $m_9$), a value of a corresponding symbol is 8, requiring 3 bits to be encoded and decoded utilizing the sub-tree. Thus, the code length of the symbol 8 is 3, i.e. the parameter cl ($m_9$) is 3. As another example, as shown in FIG. 5, if the value of i in the parameter $m_i$ is 16 (i.e. $m_{16}$), a value of a corresponding symbol is 15, requiring 4 bits to be encoded and decoded utilizing the sub-tree. Thus, the code length of the symbol 15 is 4, i.e. the parameter cl ($m_{16}$) is 4.

The parameter sign ($m_i$) that represents a node corresponding to the parameter $m_i$ is a symbol or a codeword. In one embodiment, if the parameter sign ($m_i$) is 0, the node corresponding to the parameter sign ($m_i$) is a symbol. If the parameter sign ($m_i$) is 1, the node corresponding to the parameter sign ($m_i$) is a codeword. In alternative embodiments, the parameter sign ($m_i$) may be other digits or letters. The parameter len ($m_i$) represents a length of a sub-tree divided according to an HC operation. The parameter pat ($m_i$) represents a bit pattern of a sub-tree divided according to a BPX operation, whose root is a codeword corresponding to the parameter $m_i$, and the parameter bl ($m_i$) represents a code length corresponding to the parameter pat ($m_i$). The bit pattern represents a path traversing an ASG Huffman tree. For example, as in FIG. 5, if a left child of a parent node represents a binary bit 0 and a right child of the parent node represents a binary bit 1, a path traversing the sub-tree from a node 23 through nodes 47, 94, and 189, and finally to a node 11 can be represented by the parameter pat $(m_{12})=(1011)_2=(11)_{10}$, and the parameter bl $(m_{12})=4$. Similarly, as in FIG. 6, a path traversing the sub-tree from a node 188 through nodes 376, 752, and 1504, and finally to a node 12 can be represented by the parameter pat $(m_{15})=(0000)_2=0$, and the parameter bl $(m_{15})=4$.

The parameter os ($m_i$) represents an offset between a value of i in the parameter $m_i$ corresponding to a codeword of a sub-tree and a value of j in the parameter mj (j>i) corresponding to a first symbol of a next sub-tree. For example, FIG. 3 shows a sub-tree, FIG. 4 shows a next sub-tree of the sub-tree of FIG. 3, a codeword 2 of FIG. 3 is corresponding to the parameter $m_3$, which has a value 3 of i, and the first symbol of FIG. 4 is corresponding to the parameter $m_5$, which has a value 5 of j. Therefore, the offset between 3 and 5 is 2, that is, the parameter os ($m_3$) is 2.

In block S304, the processing module 41 selects other parameters corresponding to the parameter $m_i$ from the corresponding decoding table. In the embodiment, the processing module 41 decodes from the root of the ASG Huffman tree, therefore, the processing module 41 first selects the other parameters corresponding to the parameter $m_0$, including the parameter val ($m_0$), the parameter cl ($m_0$), the parameter sign ($m_0$), the parameter len ($m_0$), the parameter pat ($m_0$), the parameter bl ($m_0$), and the parameter os ($m_0$).

In block S306, the processing module 41 determines a node corresponding to the parameter $m_i$ is a symbol or a codeword. In one embodiment, the processing module 41 determines the node corresponding to the parameter $m_i$ is a symbol or a codeword according to the parameter sign ($m_i$). If the parameter sign ($m_i$) is 0, the node corresponding to the parameter $m_i$ is a symbol; if the parameter sign ($m_i$) is 1, the node corresponding to the parameter $m_i$ is a codeword.

If the processing module 41 determines the node corresponding to the parameter $m_i$ is a symbol, in block S322, the processing module 41 outputs the parameter val ($m_i$) to the database 44 for storage.

If the processing module 41 determines the node corresponding to the parameter $m_i$ is a codeword, in block S308, the processing module 41 determines whether the parameter len ($m_i$) is null.

If the processing module 41 determines the parameter len ($m_i$) is not null, in block S310, the processing module 41 sends the other parameters corresponding to the parameter $m_i$ and the bit stream to the balanced tree module 42.

In block S312, the balanced tree module 42 selects a number of the most significant bits from the bit stream equal to the parameter len ($m_i$), and determines a decimal value of the selected bits from the bit stream.

In block S314, the balanced tree module 42 adds the value of i in the parameter $m_i$, the parameter os ($m_i$), and the decimal value of the received bits from the bit stream to get a value of another i in the parameter $m_i$ and sends the value of another i in the parameter $m_i$ and a remaining bit stream to the processing module 41. Then, the process returns to block S304.

If the processing module 41 determines the parameter len ($m_i$) is null, in block S316, the processing module 41 sends the other parameters corresponding to the parameter $m_i$ and the bit stream to the bit pattern matching module 43.

In block S318, the bit pattern matching module 43 selects a number of bits from the bit stream equal to the parameter bl ($m_i$), compares the selected bits with a binary value of the parameter pat ($m_i$), and counts a number of leading bits having the same value in the result of the comparison. In one embodiment, the bit pattern matching module 43 compares the selected bits with the binary value of the parameter pat ($m_i$) via a binary exclusive OR operation (XOR).

In block S320, the bit pattern matching module 43 sets a value of another i in the parameter $m_i$ as the value of i in the parameter $m_i$ plus the parameter os ($m_i$) plus the number of leading bits having the same value, and sends the value of another i in the parameter $m_i$ and the remaining bit stream to the processing module 41. Then, the process returns to block S304.

Referring to FIGS. 2-7, in block S300, the decoder 40 receives the encoding message and the bit stream 101111010 sent by the encoder 30. Then, in block S302, the decoder 40 selects the corresponding decoding table including the parameters $m_i$, val, cl, sign, len, pat, bl, and os, and the values of the subscripted i the parameter $m_i$ are variable from 0 to 22.

The processing module 41, in one embodiment, may decode from the root of the ASG Huffman tree. In this embodiment, in block S304, the processing module 41 first selects the other parameters corresponding to the parameter $m_0$, including the parameter val ($m_0$), the parameter cl ($m_0$), the parameter sign ($m_0$), the parameter len ($m_0$), the parameter pat ($m_0$), the parameter bl ($m_0$), and the parameter os ($m_0$).

Then, in block S306, the processing module 41 determines a node corresponding to the parameter $m_0$ is a symbol or a codeword. In the embodiment, the processing module 41 determines the node corresponding to the parameter $m_0$ is a symbol or a codeword according to the parameter sign ($m_0$). In the embodiment, if the parameter sign ($m_0$) is 1, that is, the node corresponding to the parameter $m_0$ is a codeword and block S308 is executed, where the processing module 41 determines whether the parameter len ($m_0$) is null. If the parameter len ($m_0$) is 2, which is not null, the block S310 is executed, wherein the processing module 41 sends the other parameters corresponding to the parameter $m_0$ and the bit stream 101111010 to the balanced tree module 42.

Then, in block S312, because the parameter len ($m_0$) is 2 and the parameter os ($m_0$) is 1, the balanced tree module 42 selects 2 bits from the bit stream 101111010 (i.e., the 2 most significant bits "10"), leaving the other bits as a remaining bit stream 1111010, and determines the decimal value of the selected bits "10", which is 2. In block S314, the balanced tree module 42 sets the value of another i in the parameter $m_i$ as 0 plus 1 plus 2, resulting in 3, and sends the value 3 of another i in the parameter $m_3$ and the remaining bit stream 1111010 to the processing module 41.

The process returns to block S304, wherein the processing module 41 selects the other parameters corresponding to the parameter $m_3$, including the parameter val ($m_3$), the parameter cl ($m_3$), the parameter sign ($m_3$), the parameter len ($m_3$), the parameter pat ($m_3$), the parameter bl ($m_3$), and the parameter os ($m_3$). In block S306, because the parameter sign ($m_3$) is 1, the processing module 41 determines the node corresponding to the parameter $m_3$ is a codeword. Then, block S308 is executed, and because the parameter len ($m_3$) is 3, the processing module 41 determines the parameter len ($m_3$) is not null. Therefore, in block S310, the processing module 41 sends the other parameters corresponding to the parameter $m_3$ and the remaining bit stream 1111010 to the balanced tree module 42.

In block S312, the balanced tree module 42 receives the other parameters corresponding to the parameter $m_3$ and the remaining bit stream 1111010. In the embodiment, the parameter len ($m_3$) is 3, and the parameter os ($m_3$) is 2, so the balanced tree module 42 selects 3 most significant bits from the remaining bit stream 1111010, which are "111", leaving another remaining bit stream 1010, and determines a decimal value of the selected bits "111", which is 7. In block S314, the balanced tree module 42 sets the value of another i in the parameter $m_i$ as 3 plus 2 plus 7, resulting in 12, and sends the value 12 of another i in the parameter $m_i$ and the other remaining bit stream 1010 to the processing module 41. Then, the process returns to block S304.

In block S304, the processing module 41 selects other parameters corresponding to the parameter $m_{12}$, including the parameter val ($m_{12}$), the parameter cl ($m_{12}$), the parameter sign ($m_{12}$), the parameter len ($m_{12}$), the parameter pat ($m_{12}$), the parameter bl ($m_{12}$), and the parameter os ($m_{12}$). In block S306, because the parameter sign ($m_{12}$) is 1, the processing module 41 determines the node corresponding to the parameter $m_{12}$ is a codeword, and block S308 is executed, where the processing module 41 determines the parameter len ($m_{12}$) is null. Then, in block S316, the processing module 41 sends the other parameters corresponding to the parameter $m_{12}$ and the other remaining bit stream 1010 to the bit pattern matching module 43.

In block S318, because the parameter bl ($m_{12}$) is 4, and the binary value of the parameter pat ($m_{12}$)=$(11)_{10}$=$(1011)_2$, the bit pattern matching module 43 selects 4 bits from the other remaining bit stream 1010, leaving none in the bit stream, and matches the selected 4 bits 1010 with the binary value 1011 of the parameter pat ($m_{12}$). In the embodiment, the bit pattern matching module 43 matches the selected 4 bits 1010 with the binary value 1011 via a binary XOR operation, resulting in 0001. In block S320, the bit pattern matching module 43 counts the number of leading bits having the same value of 0, which is 3, sets a value of another i in the parameter $m_i$ as 12 plus 1 plus 3, resulting in 16, and sends the value 16 of another i in the parameter $m_i$ to the processing module 41. Then, the process returns to block S304.

In block S304, the processing module 41 selects the other parameters corresponding to the parameter $m_{16}$, including the parameter val ($m_{16}$), the parameter cl ($m_{16}$), the parameter sign ($m_{16}$), the parameter len ($m_{16}$), the parameter pat ($m_{16}$), the parameter bl ($m_{16}$), and the parameter os ($m_{16}$). In block S306, because the parameter sign ($m_{16}$) is 0, the processing module 41 determines the node corresponding to the parameter $m_{16}$ is a symbol. Then, in block S322, the processing module 41 sends the parameter val ($m_{16}$), that is 15, to the database 44 for storage. Specifically, the decoder 40 decodes the bit stream 101111010 sent by the encoder 30 into 15.

The decoder 40 and the method for decoding a message using the ASG Huffman tree make decoding fast and memory effective.

The foregoing disclosure of various inventive embodiments has been presented for purposes of illustration and description. It is not intended to be exhaustive or to limit the present disclosure to the precise forms disclosed. Many variations and modifications of the embodiments described herein will be apparent to one of ordinary skill in the art in light of the above disclosure. The scope of the present disclosure is to be defined only by the claims appended hereto and their equivalents.

What is claimed is:

1. A decoder for decoding a message using an arbitrary-side growing (ASG) Huffman tree comprising a plurality of codewords and symbols, the decoder comprising:
    a database configured for storing a plurality of parameters corresponding to the ASG Huffman tree, wherein the ASG Huffman tree is divided into several sub-trees according to a Hashemian cut (HC) operation and a bits-pattern-Xor (BPX) operation, wherein the plurality of parameters comprises a bit pattern of a sub-tree divided according to the BPX operation and a code length of the bit pattern, wherein the bit pattern represents a path traversing the sub-tree;
    a processing module configured for receiving a bit stream corresponding to the ASG Huffman tree from an encoder; and
    a bit pattern matching module configured for selecting bits from the bit stream according to the code length of the bit pattern and decoding the selected bits into a symbol in the ASG Huffman tree by comparing the selected bits with the bit pattern.

2. The decoder of claim 1, wherein the bit pattern matching module compares the selected bits with the bit pattern via a binary exclusive OR operation.

3. The decoder of claim 1, wherein the bit pattern matching module determines the symbol according to a number of leading bits having the same value in the result of the comparison.

4. The decoder of claim 1, wherein the plurality of parameters further comprise a length of a sub-tree divided according to the HC operation.

5. The decoder of claim 4, further comprising a balanced tree module, for selecting bits from the bit stream according to the length of the sub-tree divided according to the HC operation and decoding the selected bits into a node in the ASG Huffman tree.

6. The decoder of claim 5, wherein the balanced tree module determines the node according to a decimal value of the selected bits.

7. The decoder of claim 5, wherein the processing module either sends the bit stream to the balanced tree module or the bit pattern matching module to be decoded according to whether the length of the sub-tree divided according to the HC operation is null.

8. A method for decoding a message using an arbitrary-side growing (ASG) Huffman tree, comprising:
    storing a plurality of parameters corresponding to the ASG Huffman tree, wherein the ASG Huffman tree is divided into several sub-trees according to a Hashemian cut (HC) operation and a bits-pattern-Xor (BPX) operation, the plurality of parameters comprise a bit pattern of a sub-tree divided according to the BPX operation and a code length of the bit pattern, wherein the bit pattern represents a path traversing the sub-tree;
    receiving a bit stream corresponding to the ASG Huffman tree from an encoder by a processing module;
    selecting bits from the bit stream according to the code length of the bit pattern by a bit pattern matching module; and
    comparing the selected bits with the bit pattern and decoding the selected bits into a symbol in the ASG Huffman tree by the bit pattern matching module.

9. The method of claim 8, wherein the block of comparing the selected bits with the bit pattern comprises:
comparing the selected bits with the bit pattern via a binary exclusive OR operation.

10. The method of claim 8, wherein the block of decoding the selected bits into a symbol in the ASG Huffman tree comprises:
determining the symbol in the ASG Huffman tree according to a number of leading bits having the same value in the result of the comparison.

11. The method of claim 8, wherein the plurality of parameters further comprise a length of a sub-tree divided according to the HC operation.

12. The method of claim 11, further comprising:
selecting bits from the bit stream according to the length of the sub-tree divided according to the HC operation by a balanced tree module; and
decoding the selected bits into a node in the ASG Huffman tree.

13. The method of claim 12, wherein the block of decoding the selected bits into a node in the ASG Huffman tree comprises:
determining the node in the ASG Huffman tree according to a decimal value of the selected bits.

14. The method of claim 12, further comprising:
determining whether the length of a sub-tree divided according to the HC operation is null by the processing module; and
sending the bit stream either to the balanced tree module or the bit pattern matching module for being decoded according to the determination by the processing module.

15. A computer-readable medium carrying one or more sequences of instructions for decoding a message using an arbitrary-side growing (ASG) Huffman tree, wherein execution of the one or more sequences of instructions by one or more processors causes the one or more processors to perform the blocks of:
storing a plurality of parameters corresponding to the ASG Huffman tree, wherein the ASG Huffman tree is divided into several sub-trees according to a Hashemian cut (HC) operation and a bits-pattern-Xor (BPX) operation, the plurality of parameters comprise a bit pattern of a sub-tree divided according to the BPX operation and a code length of the bit pattern, wherein the bit pattern represents a path traversing the sub-tree;
receiving a bit stream corresponding to the ASG Huffman tree from an encoder by a processing module;
selecting bits from the bit stream according to the code length of the bit pattern by a bit pattern matching module; and
comparing the selected bits with the bit pattern and decoding the selected bits into a symbol in the ASG Huffman tree by the bit pattern matching module.

* * * * *